US009122185B2

(12) United States Patent
Takahashi et al.

(10) Patent No.: US 9,122,185 B2
(45) Date of Patent: Sep. 1, 2015

(54) IMAGE FORMING APPARATUS DETERMINING TRANSFER PARAMETER USING COLOR MEASUREMENT RESULT, IMAGE FORMING METHOD, AND NON-TRANSITORY COMPUTER READABLE MEDIUM

(75) Inventors: Nobukazu Takahashi, Kanagawa (JP); Tomoshi Hara, Kanagawa (JP); Shuichi Sugimoto, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 200 days.

(21) Appl. No.: 13/570,901

(22) Filed: Aug. 9, 2012

(65) Prior Publication Data

US 2013/0250318 A1 Sep. 26, 2013

(30) Foreign Application Priority Data

Mar. 21, 2012 (JP) ................................ 2012-063954

(51) Int. Cl.

| | |
|---|---|
| ***G03F 3/08*** | (2006.01) |
| ***G03G 15/01*** | (2006.01) |
| ***G03G 15/16*** | (2006.01) |
| ***G03G 15/00*** | (2006.01) |

(52) U.S. Cl.
CPC ........ *G03G 15/0189* (2013.01); *G03G 15/1675* (2013.01); *G03G 15/5062* (2013.01); *G03G 15/6591* (2013.01)

(58) Field of Classification Search
CPC .......... G03G 15/1675; G03G 15/1645; G03G 15/5025; G03G 15/5062
USPC ........................... 358/1.9, 518, 2.1, 3.01, 504
See application file for complete search history.

(56) References Cited

U.S. PATENT DOCUMENTS

| | | | | |
|---|---|---|---|---|
| 4,959,669 | A * | 9/1990 | Haneda et al. | 347/115 |
| 5,541,736 | A * | 7/1996 | Sagara et al. | 358/1.9 |
| 8,886,067 | B2 * | 11/2014 | Hano | 399/49 |
| 2005/0249515 | A1 * | 11/2005 | Furukawa et al. | 399/53 |
| 2007/0047986 | A1 | 3/2007 | Fujimori et al. | |
| 2008/0118257 | A1 * | 5/2008 | Murakami | 399/49 |
| 2009/0086245 | A1 * | 4/2009 | Sugiyama | 358/1.13 |
| 2012/0062928 | A1 * | 3/2012 | Tsubouchi | 358/1.14 |
| 2012/0314227 | A1 * | 12/2012 | Zaima et al. | 358/1.2 |
| 2013/0034359 | A1 * | 2/2013 | Shirafuji et al. | 399/49 |

FOREIGN PATENT DOCUMENTS

| | | | | |
|---|---|---|---|---|
| JP | A-2006-039090 | | 2/2006 | |
| JP | A-2007-065389 | | 3/2007 | |
| JP | 2007-298669 | * | 11/2007 | G03G 15/01 |

* cited by examiner

*Primary Examiner* — Barbara Reinier
(74) *Attorney, Agent, or Firm* — Oliff PLC

(57) ABSTRACT

An image forming apparatus includes a measuring unit, an adjustment image forming unit, a density value calculating unit, and a transfer parameter determining unit. The measuring unit measures colors of an image formed on a recording medium. The adjustment image forming unit forms an adjustment image including a combination color which is produced by superimposing colorants of two or more component colors. The density value calculating unit calculates, in accordance with a measurement result obtained by measuring the combination color included in the adjustment image by the measuring unit, a density value of a component color of a colorant that is formed in an uppermost layer on the recording medium among the two or more component colors. The transfer parameter determining unit determines a value of a transfer parameter in accordance with the calculated density value, the transfer parameter defining an operation condition used for performing transfer.

6 Claims, 5 Drawing Sheets

FIG. 6

| | HIGH DENSITY | MIDDLE DENSITY | LOW DENSITY |
|---|---|---|---|
| Y | 8 | 3 | 5 |
| M | 8 | 3 | 5 |
| C | 8 | 3 | 5 |
| K | 6 | 1 | 2 |
| R | 9 | 4 | 5 |
| G | 9 | 4 | 5 |
| B | 9 | 3 | 5 |
| PK | 10 | 4 | 5 |
| MAXIMUM VALUE | 10 | 4 | 5 |
| MINIMUM VALUE | 6 | 1 | 2 |
| AVERAGE VALUE | 8 | 3 | 4 |

FIG. 7

| | CANDIDATE VALUES FOR SUPPRESSING UNEVENNESS OF TRANSFER |
|---|---|
| Y | 7 |
| M | 7 |
| C | 7 |
| K | 6 |
| R | 7 |
| G | 7 |
| B | 6 |
| PK | 6 |
| MAXIMUM VALUE | 7 |
| MINIMUM VALUE | 6 |
| AVERAGE VALUE | 7 |

IMAGE FORMING APPARATUS DETERMINING TRANSFER PARAMETER USING COLOR MEASUREMENT RESULT, IMAGE FORMING METHOD, AND NON-TRANSITORY COMPUTER READABLE MEDIUM

CROSS-REFERENCE TO RELATED APPLICATIONS

This application is based on and claims priority under 35 USC 119 from Japanese Patent Application No. 2012-063954 filed Mar. 21, 2012.

BACKGROUND (i) Technical Field

The present invention relates to an image forming apparatus, an image forming method, and a non-transitory computer readable medium.

(ii) Related Art

An image forming apparatus is available which forms an image on a recording medium, such as paper, by transferring component-color images formed by using colorants of plural component colors. For example, an electrophotographic image forming apparatus which uses toners of four colors including yellow (Y), magenta (M), cyan (C), and black (B) as colorants forms a color image by transferring four component-color images onto a recording medium. The four component-color images are a Y-component-color image formed by using a yellow toner, an M-component-color image formed by using a magenta toner, a C-component-color image formed by using a cyan toner, and a K-component-color image formed by using a black toner. Accordingly, a color image having various colors is expressed by superimposition of the limited component colors. The following methods may be used as an image forming method for the image forming apparatus: a method for directly transferring plural component-color images onto a recording medium one by one; and a method for transferring plural component-color images onto an intermediate transfer body in a superimposed manner and then transferring the plural component-color images superimposed on the intermediate transfer body onto a recording medium at one time.

The image forming apparatus transfers component-color images onto a recording medium in accordance with an operation condition defined by a transfer parameter. The transfer parameter may be, for example, a value which defines a voltage applied to a transfer roller (transfer voltage). The optimum value of the transfer parameter varies depending on an environment in which the image forming apparatus is used, the type of recording medium to be used, etc.

SUMMARY

According to an aspect of the invention, there is provided an image forming apparatus including a measuring unit, an adjustment image forming unit, a density value calculating unit, and a transfer parameter determining unit. The measuring unit measures colors of an image formed on a recording medium. The adjustment image forming unit forms an adjustment image including a combination color which is produced by superimposing colorants of two or more component colors. The density value calculating unit calculates, in accordance with a measurement result obtained by measuring the combination color included in the adjustment image by the measuring unit, a density value of a component color of a colorant that is formed in an uppermost layer on the recording medium among the two or more component colors. The transfer parameter determining unit determines a value of a transfer parameter in accordance with the calculated density value, the transfer parameter defining an operation condition used for performing transfer.

BRIEF DESCRIPTION OF THE DRAWINGS

An exemplary embodiment of the present invention will be described in detail based on the following figures, wherein:

FIG. 6 is a diagram illustrating an example of optimum values of a transfer parameter obtained for patch images of individual colors and individual densities; and FIG. 7 is a diagram illustrating an example of optimum values of a transfer parameter obtained for band images of individual colors.

DETAILED DESCRIPTION

Hereinafter, an exemplary embodiment of the present invention will be described in detail with reference to the attached drawings.

Figure 1:
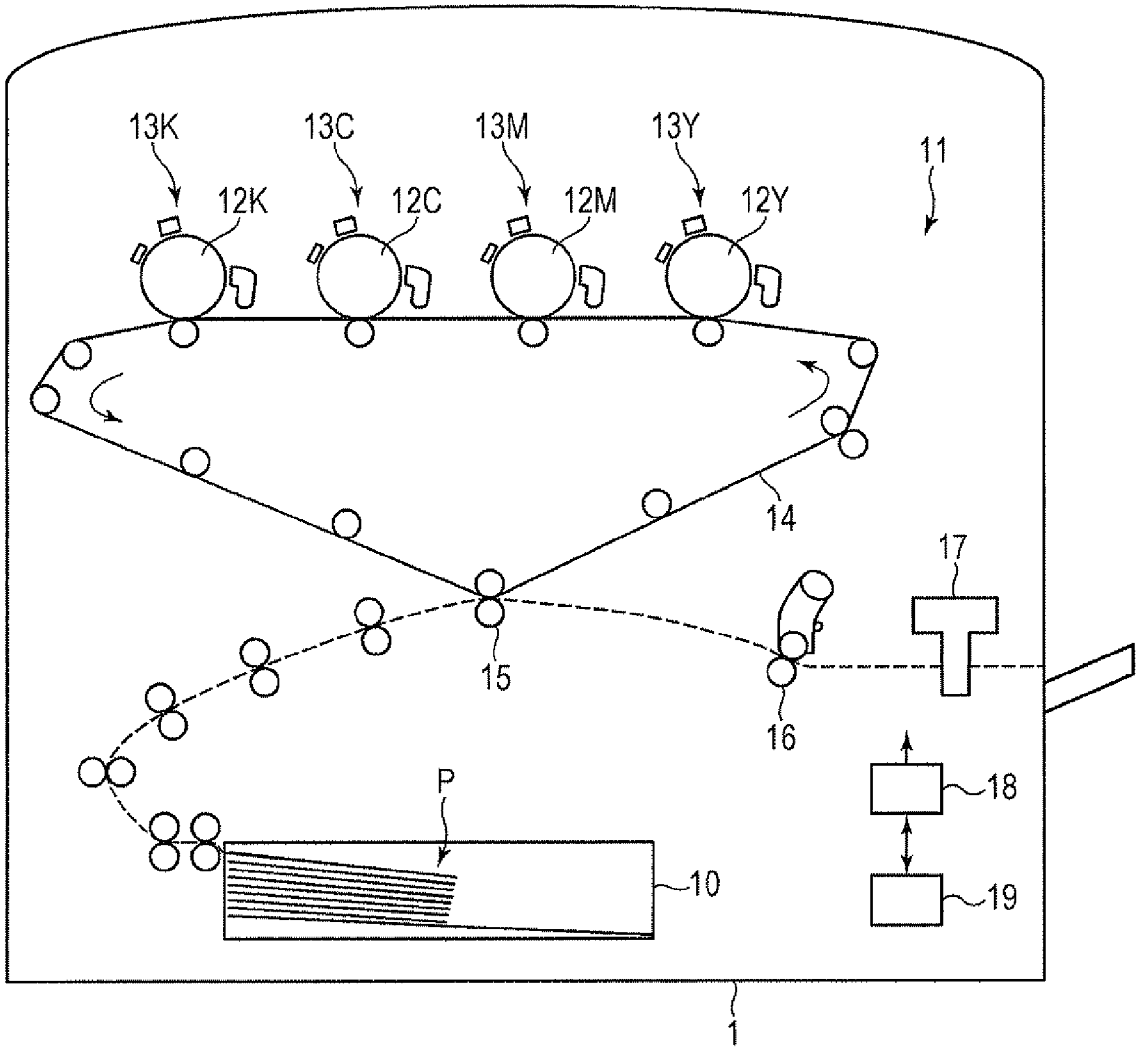
FIG. 1 is a diagram illustrating a schematic configuration of an image forming apparatus according to an exemplary embodiment of the present invention.

An image forming apparatus 1 according to the exemplary embodiment is an apparatus that forms an image on a recording medium P (here, a sheet of paper). As illustrated in FIG. 1, the image forming apparatus 1 includes a paper feed tray 10, an image forming unit 11, a sensor 17, a controller 18, and a memory 19. The image forming unit 11 includes four photoconductors 12, four component-color image forming units 13, an intermediate transfer body 14, a transfer unit 15, and a fixing unit 16.

The recording medium P fed from the paper feed tray 10 is transported along a medium transport path, which is represented by a broken line in FIG. 1.

The photoconductors 12 are photoconductor drums or the like. Component-color images formed of colorant, such as toner, are formed on the photoconductors 12 by the component-color image forming units 13. The image forming apparatus 1 according to the exemplary embodiment uses toners of four colors including yellow (Y), magenta (M), cyan (C), and black (K) as colorants, and includes four photoconductors 12Y, 12M, 12C, and 12K corresponding to the respective colors. Also, the image forming apparatus 1 includes four component-color image forming units 13Y, 13M, 13C, and 13K. Each of the component-color image forming units 13 includes a charging device, a light source, and a developing device, and forms a component-color image of the corresponding component color on the corresponding photoconductor 12.

The intermediate transfer body 14 is a transfer belt or the like. Component-color images formed on the photoconductors 12 by the component-color image forming units 13 are transferred onto the intermediate transfer body 14. Arrows in FIG. 1 indicate the direction in which the intermediate transfer body 14 rotates during image formation. The order in which component-color images of four colors are transferred onto the intermediate transfer body 14 is determined in accordance with the arrangement of the photoconductors 12 in the apparatus and the rotation direction of the intermediate transfer body 14. Here, for example, it is assumed that a Y-component-color image is transferred from the photoconductor 12Y onto the intermediate transfer body 14, and then an M-component-color image, a C-component-color image, and a K-component-color image are transferred in this order from the photoconductors 12M, 12C, and 12K onto the intermediate transfer body 14. As a result, an intermediate image, which is composed of the Y-component-color image, M-component-color image, C-component-color image, and K-component-color image superimposed in this order, is formed on the intermediate transfer body 14.

The transfer unit 15 transfers an intermediate image, which is composed of plural component-color images stacked on the intermediate transfer body 14, onto the recording medium P moving along the medium transport path. The transfer unit 15 includes, for example, a transfer roller. The operation of the transfer unit 15 is controlled by the controller 18 in accordance with a set value of a transfer parameter, which will be described below. Hereinafter, an image formed on the recording medium P through a transfer process performed by the transfer unit 15 will be referred to as a transferred image. This transferred image is composed of component-color images stacked in an order which is the opposite of the order in which the component-color images of the intermediate image are stacked on the intermediate transfer body 14. That is, the transferred image on the recording medium P is composed of a K-component-color image, a C-component-color image, an M-component-color image, and a Y-component-color image stacked in this order.

The fixing unit 16 includes a fixing roller or the like, and causes colorants constituting a transferred image on the recording medium P to be fixed onto the recording medium P by using heat and pressure. With the above-described elements, the image forming unit 11 forms a color image composed of plural component colors on the recording medium P.

The sensor 17 is disposed along the medium transport path, and measures the colors of a transferred image formed on the recording medium P which is transported along the medium transport path. The sensor 17 detects the colors of a transferred image before the image forming apparatus 1 outputs the recording medium P to the outside. The sensor 17 includes plural units disposed along the rotation axis direction of the intermediate transfer body 14, which simultaneously measure the colors at plural points on the recording medium P along the rotation axis direction.

The controller 18 is a central processing unit (CPU) or the like, and operates in accordance with a program stored in the memory 19. The controller 18 controls the operations of individual units constituting the image forming unit 11, so as to form an image on the recording medium P. Particularly in the exemplary embodiment, the controller 18 controls the operation of the transfer unit 15 in accordance with the value of a transfer parameter stored in the memory 19. The transfer parameter may be a parameter which defines a voltage applied to the transfer roller when the transfer unit 15 performs transfer (transfer voltage), or may be a parameter which defines a current flowing through the transfer roller.

The memory 19 includes a random access memory (RAM), a nonvolatile RAM (NVRAM), or the like. The memory 19 stores a program executed by the controller 18. The memory 19 operates as a working memory for the controller 18.

Figure 2:
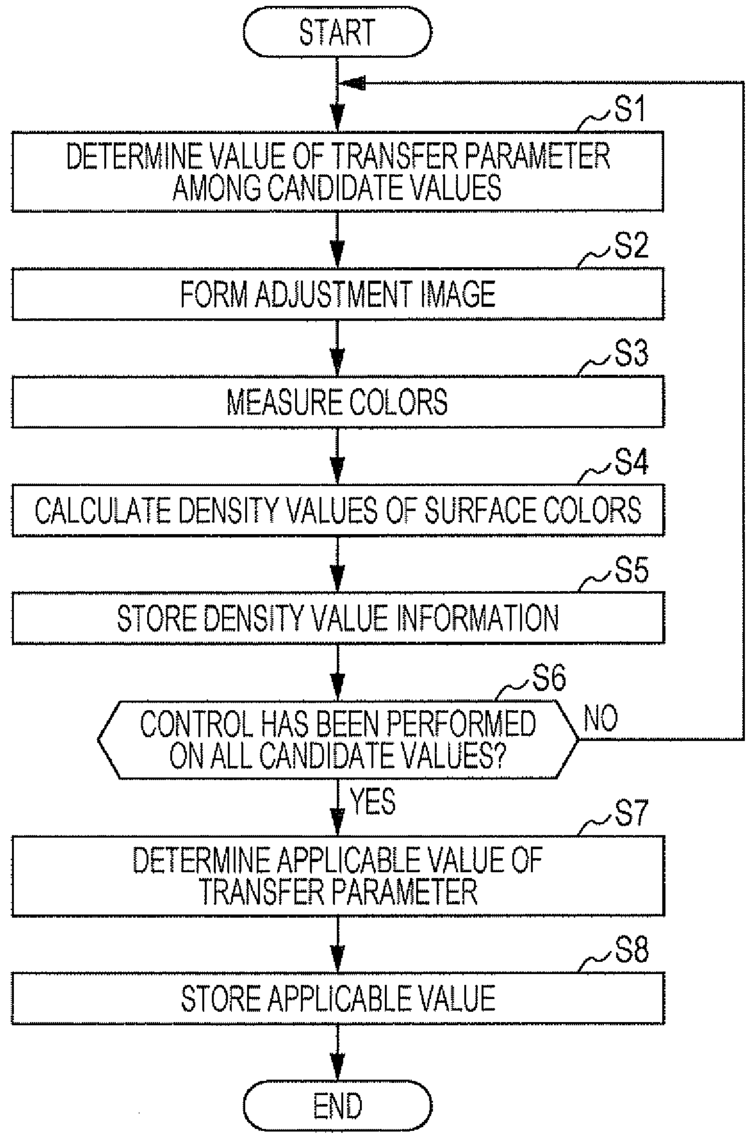
FIG. 2 is a flowchart illustrating an example of a transfer parameter adjustment process.

Hereinafter, an example of a transfer parameter adjustment process executed by the image forming apparatus 1 will be described with reference to the flowchart illustrated in FIG. 2. The image forming apparatus 1 executes the transfer parameter adjustment process upon receiving an instruction to adjust a transfer parameter from a user.

In step S1, the image forming apparatus 1 determines a value of a transfer parameter that is to be set for forming an image for adjustment (hereinafter referred to as an adjustment image), among plural candidate values that may be set. Here, for example, the candidate values of the transfer parameter are integer values of one to eleven. In the first process, a predetermined initial value (for example, one) may be set as a value of the transfer parameter. In the second and subsequent processes, the set value of the transfer parameter is sequentially changed, that is, a candidate value different from the candidate value used in the preceding process is determined as a new set value of the transfer parameter.

In step S2, the image forming apparatus 1 forms an adjustment image on the recording medium P in accordance with the control performed by the controller 18. At this time, the controller 18 controls the operation of the transfer unit 15 by using the value of the transfer parameter determined in step S1.

Figure 3:
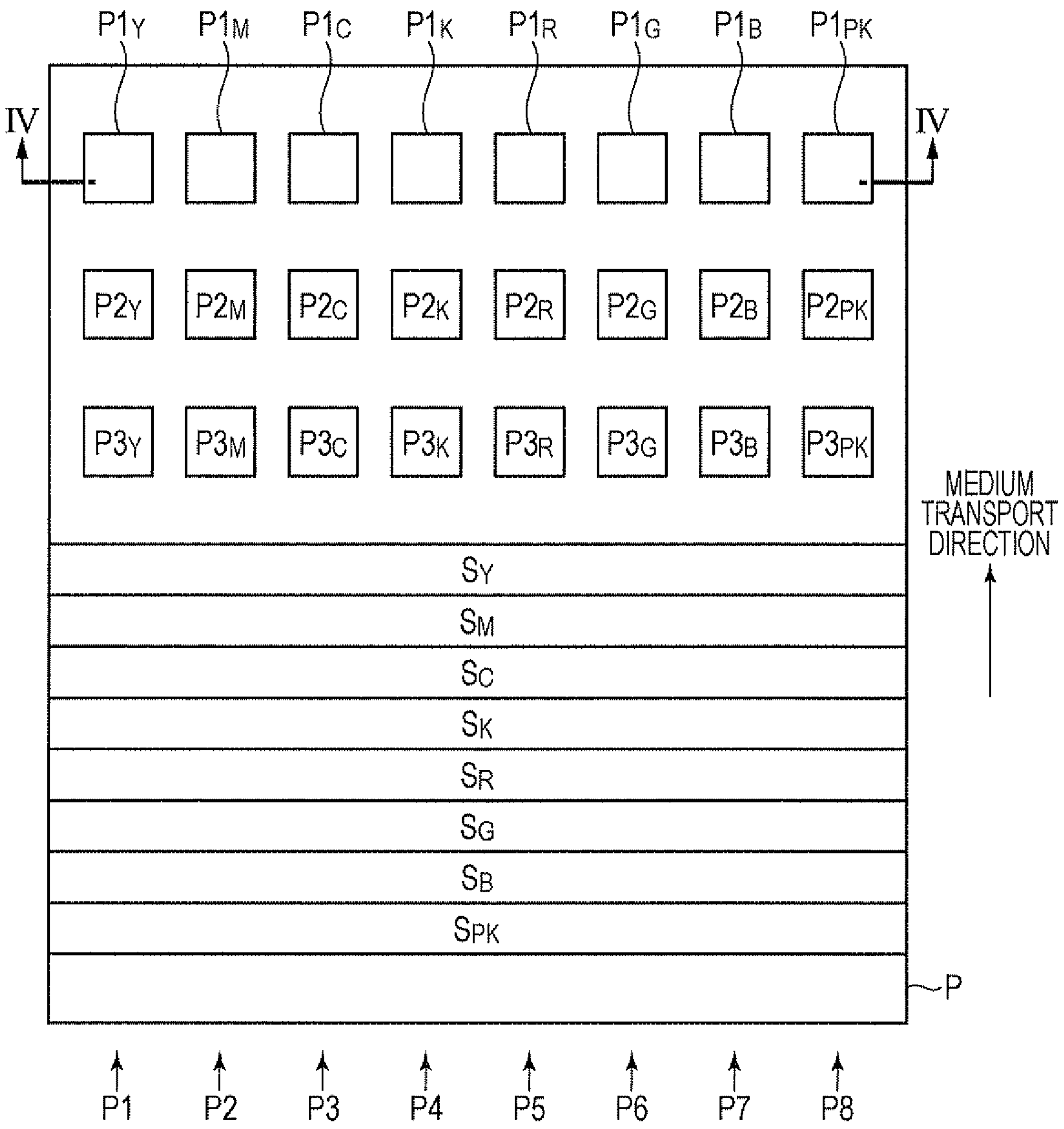
FIG. 3 is a diagram illustrating an example of an adjustment image.

FIG. 3 is a diagram illustrating an example of the adjustment image formed in step S2. In the example illustrated in FIG. 3, the adjustment image is formed of the following eight types of colors: single component colors of Y, M, C, and K; an R combination color (red) obtained by superimposing Y and M; a G combination color (green) obtained by superimposing Y and C; a B combination color (blue) obtained by superimposing M and C; and a PK combination color obtained by superimposing Y, M, and C. More specifically, patch images having densities in three levels (low density, middle density, and high density) of the eight types of colors are disposed in an upper portion of the adjustment image. In FIG. 3, the patch images having a low density of the individual component colors are denoted by reference symbols $\mathbf{P1}_X$, the patch images having a middle density are denoted by reference symbols $\mathbf{P2}_X$, and the patch images having a high density are denoted by reference symbols $\mathbf{P3}_X$ (here, X=Y, M, C, K, R, G, B, and PK).

Also, band images of the eight types of colors extending in a band shape or substantially band shape along a lateral direction are disposed in a lower portion of the adjustment image. Here, the lateral direction of the adjustment image is a direction perpendicular to the transport direction of the recording medium P, and corresponds to the rotation axis direction of the intermediate transfer body 14. In FIG. 3, the band image of an X component color is denoted by $S_X$ (X=Y, M, C, K, R, G, B, and PK). These band images are used for detecting whether or not there is unevenness of transfer in the rotation axis direction. Depending on a set value of a transfer parameter, unevenness of transfer may occur in which, for example, transfer is appropriately performed at the center of the recording medium P and near the center, but is not appropriately performed at the right and left ends of the recording medium P, and the density at the center and near the center is different from the density at the ends even if the color is the same. Accordingly, in the exemplary embodiment, whether or not there is unevenness of colors in the band images is determined, and thereby whether or not there is unevenness of transfer is determined, as will be described below.

Figure 4:
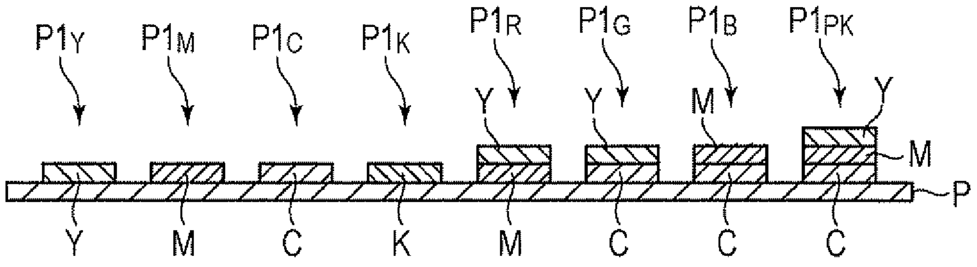
FIG. 4 is a diagram schematically illustrating a cross section, taken along line IV-IV of FIG. 3, of a recording medium on which the adjustment image illustrated in FIG. 3 is formed.

As described above, an image formed on the recording medium P is composed of four component-color images stacked in a predetermined order. Thus, in a portion of the adjustment image where a combination color is expressed by superimposing plural component colors, the colorant of a certain color among plural component colors constituting the combination color is always in the uppermost layer (on the surface side of the recording medium P). FIG. 4 is a diagram schematically illustrating a cross section, taken along line IV-IV of FIG. 3, of the recording medium P on which the adjustment image is formed, and illustrates a state where each of patch images of individual colors is formed of a colorant of a single component color or a stack of colorants of plural component colors. In FIG. 4, each of the symbols Y, M, C, and K represents the colorant of the corresponding component color. As illustrated in FIG. 4, regarding the R, G, and PK combination colors, the colorant of the Y component color is in the uppermost layer and is exposed on the surface side of the recording medium P. Regarding the B combination color, the colorant of the M component color is exposed on the surface side of the recording medium P. Regarding the C component color, the colorant thereof is exposed on the surface side of the recording medium P in the patch image of the single C component color. When the C component color is used in a combination color, the colorant thereof is in a layer under the colorant of another component color, and is not exposed on the surface side of the recording medium P. Hereinafter, for the convenience of description, the component color of the colorant in the uppermost layer in each of the eight types of colors included in the adjustment image (that is, the component color which is not covered by any other component colors and is exposed on the surface side of the recording medium P) will be referred to as a surface color. As described above, the Y component color is a surface color in the R, G, and PK combination colors, and the M component color is a surface color in the B combination color. Regarding the Y, M, C, and K component colors, each of the component colors serves as a surface color.

After the adjustment image is formed on the recording medium P in step S2, the sensor 17 measures the colors included in the adjustment image in step S3. Specifically, the sensor 17 measures the colors in the individual patch images, and measures colors at plural measurement points at different positions in the lateral direction of the recording medium P in the individual band images. Here, for example, the eight points corresponding to the positions where the patch images are formed are regarded as measurement points P1 to P8, as illustrated in FIG. 3, and the colors at the eight measurement points P1 to P8 in the individual band images are detected.

In step S4, the controller 18 performs color conversion, in which a color component of a surface color is extracted from among the colors measured by the sensor 17, on each of the patch images and band images of the combination colors included in the adjustment image, and calculates density values of surface colors. Specifically, color conversion of extracting a Y component color included in the measured colors is performed on the patch images and band images of the R, G, and PK combination colors, and the density values of the Y component color are calculated. Likewise, color conversion of extracting an M component color included in the measured colors is performed on the patch images and band image of the B combination color, and the density values of the M component color are calculated. Such color conversion is not necessary for the patch images and band images of the single colors Y, M, C, and K, and the density values of the corresponding component colors indicated by a detection result obtained from the sensor 17 may be output. With this process, density value information regarding surface colors may be obtained from the twenty-four patch images included in one adjustment image. Also, density value information regarding eight surface colors may be obtained from the eight band images. The density value information regarding the surface colors of the individual patch images and band images calculated in step S4 is temporarily stored in the memory 19 in step S5.

After step S5 has ended, the controller 18 determines in step S6 whether or not the control in steps S2 to S5 has been performed on all the candidate values of the transfer parameter. If there is a candidate value on which the control has not been performed, the process returns to step S1, where the image forming apparatus 1 sets the candidate value as a new set value, and outputs an adjustment image by using the new set value. If the control in steps S2 to S5 has been performed on all the candidate values of the transfer parameter, the image forming apparatus 1 determines, in step S7, the value of the transfer parameter to be set for an image formation process that is to be performed (hereinafter referred to as an applicable value of the transfer parameter), in accordance with the density value information regarding surface colors obtained through the control. A specific method for determining an applicable value of the transfer parameter will be described below. The controller 18 stores the determined applicable value in the memory 19 in step S8, and then ends the transfer parameter adjustment process. After that, the controller 18 performs image formation by controlling the operation of the transfer unit 15 by using the applicable value stored in step S8.

As described above, the image forming apparatus 1 according to the exemplary embodiment determines an applicable value of a transfer parameter by using density values of surface colors of patch images and band images of combination colors, instead of using a measurement result of the combination colors themselves. This is because an effect obtained by changing the value of a transfer parameter remarkably emerges in the density of a surface color. For example, when the value of a transfer parameter is not optimum and when transfer of colorants from the intermediate transfer body 14 onto the recording medium P is not adequately performed, a colorant forming an intermediate image may remain on the intermediate transfer body 14. The color of the colorant that remains at this time corresponds to a surface color. Regarding the colorant of a combination color produced by superimposing plural component colors, colorants of the colors except a surface color are usually transferred without any problem, whereas a colorant of the surface color may not be adequately transferred if the value of the transfer parameter is not optimum. Thus, in the case of evaluating whether or not the colorant of a combination color is being transferred with sufficiently high quality, it is appropriate to perform evaluation by using the density of a surface color rather than the entire combination color. As a result of paying attention to a surface color in this way, an influence of difference in the type or color of the recording medium P may be prevented from being exerted on a color measurement result obtained from the sensor 17.

Figure 5:
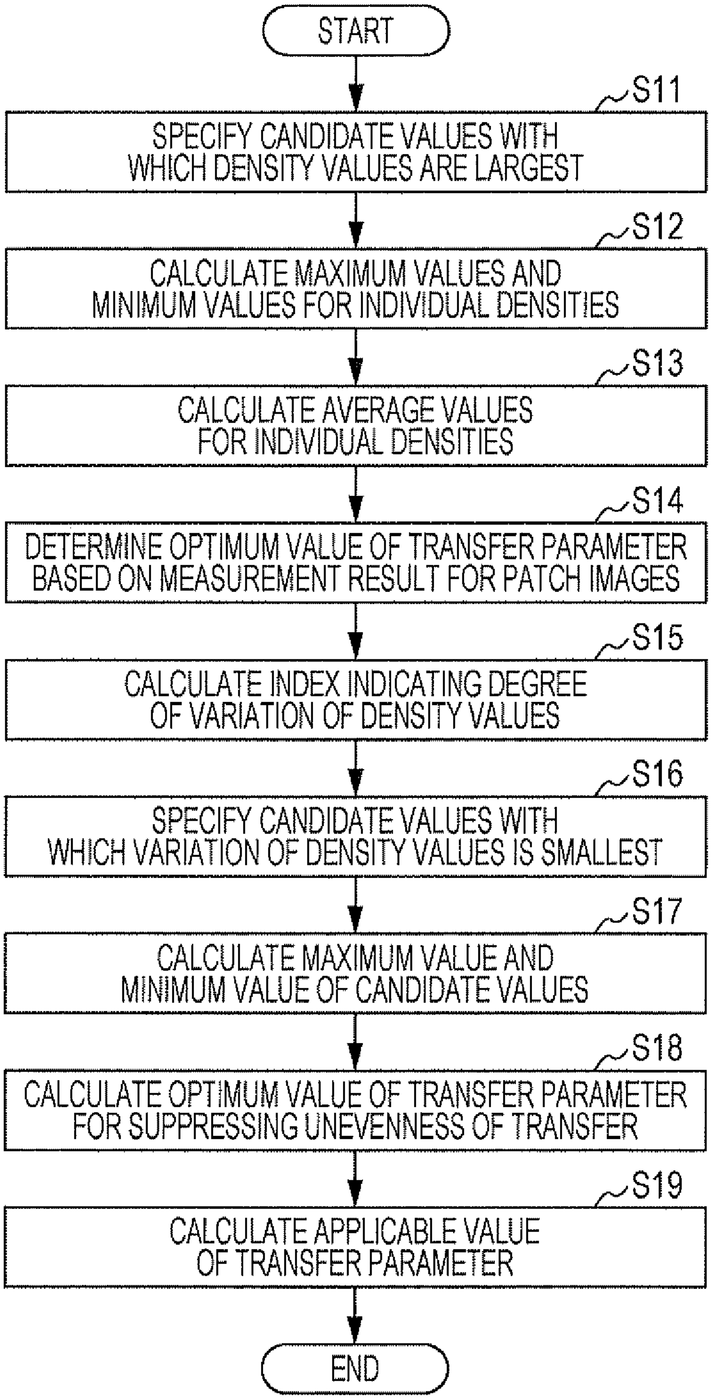
FIG. 5 is a flowchart illustrating an example of a process of calculating an applicable value of a transfer parameter.

Hereinafter, a specific example of a process of determining an applicable value of a transfer parameter, which is performed in step S7 in FIG. 2, will be described with reference to the flowchart illustrated in FIG. 5.

First, the controller 18 calculates an optimum value of a transfer parameter which is based on a measurement result for the patch images obtained from the sensor 17. Specifically, in step S11, the controller 18 specifies, for the individual twenty-four patch images, candidate values with which density values of surface colors are the largest among plural candidate values of the transfer parameter. The candidate values specified here are regarded as the optimum values of the transfer parameter to be used for forming the colors of the individual patch images. For example, it is assumed that the density value of the M component color as a surface color is the largest when the value of the transfer parameter is set to three for the patch image $P2_B$ having a middle density of the B combination color. In this case, the value of the transfer parameter suitable for forming the B combination color at a middle density is three. Also, the values of the transfer parameter with which density values of surface colors are the largest are specified for the individual twenty-four patch images in a similar way.

In step S12, the controller 18 calculates the maximum values and minimum values of the optimum candidate values obtained in step S11 for the eight patch images P1 having a high density, the eight patch images P2 having a middle density, and the eight patch images P3 having a low density. For example, it is assumed that the values illustrated in FIG. 6 are obtained as the optimum values of the transfer parameter for the individual patch images in step S11. In this case, the maximum values for high density, middle density, and low density are ten, four, and five, respectively, and the minimum values therefor are six, one, and two, respectively.

In step S13, the controller 18 calculates the average values of the maximum values and minimum values calculated in step S12 for high density, middle density, and low density. In the example illustrated in FIG. 6, the average values for high density, middle density, and low density are eight, three, and four, respectively (here, each value is rounded off to the closest whole number). The average values calculated for the individual densities are estimated as optimum values of the transfer parameter to be used for forming various colors at the corresponding densities. That is, it is appropriate to set the value of the transfer parameter to eight in order to form a color having a high density, and it is appropriate to set the values of the transfer parameter to three and four in order to form a color having a middle density and a color having a low density, respectively.

In step S14, the controller 18 multiplies a predetermined weight coefficient by each of the three average values calculated in step S13 and calculates the average value thereof, thereby determining an optimum value of the transfer parameter based on the measurement result for the patch images. Here, the weight coefficient is predetermined depending on the degree of priority placed on high density, middle density, and low density by the user of the image forming apparatus 1. When the same degree of priority is placed on all the densities, the average value of the three average values may be calculated without using a weight coefficient.

Subsequently, the controller 18 calculates an optimum value of a transfer parameter in view of unevenness of transfer in the rotation axis direction of the intermediate transfer body 14, by using a measurement result for the band images. Specifically, in step S15, the controller 18 calculates, regarding the individual sets of the candidate values of the transfer parameter and the colors of band images, an index indicating the degree of variation of density values of eight surface colors obtained by measuring the colors of the band images formed by applying the corresponding candidate values. This index may be dispersion of eight density values, or may be a statistical index value.

In step S16, the controller 18 specifies, for the band images of the individual colors, candidate values of the transfer parameter with which variation of the density value of the surface color in the rotation axis direction is the smallest. For example, it is assumed that, regarding the B combination color, variation of the density value of the surface color (M component color) obtained by performing measurement at the eight measurement points P in one band image $S_B$ is the smallest when the value of the transfer parameter is set to six. In this case, it is the most appropriate to set the value of the transfer parameter to six in order to suppress unevenness of transfer of the B combination color. Thus, the controller 18 specifies six as the value of the transfer parameter that is the most appropriate for the B combination color. FIG. 7 illustrates an example of candidate values for the individual colors specified as values of the transfer parameter for suppressing unevenness of transfer.

In step S17, the controller 18 calculates the maximum value and minimum value of the candidate values obtained in step S16. In the example illustrated in FIG. 7, the maximum value and minimum value are seven and six, respectively. In step S18, the controller 18 calculates the average value of the maximum value and minimum value calculated in step S17. In the example illustrated in FIG. 7, the average value is seven (here, the value is rounded off to the closest whole number). The average value calculated through this process is an optimum value of the transfer parameter that is appropriate for suppressing unevenness of transfer in the rotation axis direction.

In step S19, the controller 18 calculates the average value of the optimum value calculated in step S14 and the optimum value calculated in step S18. The average value obtained here serves as an applicable value of the transfer parameter. In step S19, the average value may be calculated after multiplying a predetermined weight coefficient by each of the two optimum values. By using such a weight coefficient, an applicable value of a transfer parameter may be obtained in accordance with the preference of a user or applications, for example, an applicable value for suppressing unevenness of transfer in the rotation axis direction, or an applicable value for performing appropriate transfer of individual colors.

The above-described method for calculating an applicable value of a transfer parameter is merely an example. The controller 18 may calculate an applicable value of a transfer parameter by using another calculation method. For example, in the above-described method, the maximum values and minimum values of optimum candidate values of individual colors are calculated for individual densities in step S12, and the average values of the maximum values and minimum values are calculated in step S13. Alternatively, the average values of the optimum candidate values obtained for the eight colors may be directly calculated. Also, regarding the candidate values for suppressing unevenness of transfer of individual colors, the average value of the candidate values may be directly calculated instead of performing steps S17 and S18. Particularly, in a case where a user places priority on a certain color, an average value may be calculated by multiplying a weight coefficient by results of individual colors so that the optimum value of the transfer parameter obtained for the certain color is reflected by an applicable value that is eventually determined.

An applicable value of a transfer parameter may be calculated by using only a result that is obtained regarding a color or characteristic on which priority is placed. For example, in a case where a user places priority on suppressing unevenness of transfer in the rotation axis direction, the optimum value of the transfer parameter obtained in step S18 may be used as an applicable value. In this case, patch images are not necessary for an adjustment image. On the other hand, in a case where priority is not placed on suppressing unevenness of transfer, no band image may be included in an adjustment image, and the optimum value calculated in step S14 may be used as the optimum value of the transfer parameter. In a case where a user places special priority on the B combination color, an applicable value of a transfer parameter may be determined by performing the above-described process by using an adjustment image including only the patch image and band image of the B combination color.

The image forming apparatus 1 may perform the above-described process on each of plural types of sheets used thereby, and may determine different applicable values of transfer parameters for the individual types of sheets. In the description given above, an adjustment image is formed on a new recording medium P every time candidate values of a transfer parameter are changed. Alternatively, patch images and band images that are obtained by setting individual candidate values of plural transfer parameters may be included in one adjustment image. In this case, the image forming apparatus 1 forms plural patch images and band images in one chart image while sequentially changing a set value of the transfer parameter to a new candidate value.

In the description given above, component-color images formed on the individual photoconductors 12 are transferred onto the intermediate transfer body 14, and are then transferred onto the recording medium P by the transfer unit 15. Alternatively, the component-color images formed on the individual photoconductors 12 may be directly transferred onto the recording medium P. In this case, the intermediate transfer body 14 is not necessary. Also in this case, transfer of the component-color images formed on the individual photoconductors 12 onto the recording medium P is controlled by using a transfer parameter. The image forming apparatus 1 determines the value of the transfer parameter in accordance with the density value of the component color formed in the uppermost layer in a combination color formed on the recording medium P. Accordingly, an influence of change in the transfer parameter exerted on a transferred image may be evaluated more accurately.

In the description given above, the image forming apparatus 1 forms images by using toners of four component colors. The number of component colors is not limited to four, and may be another number. Even in the case of expressing a combination color by superimposing more than three component colors, an influence of change in the transfer parameter exerted on a transferred image may be evaluated more accurately by determining the value of the transfer parameter in accordance with the density value of the component color that is eventually formed in the uppermost layer on the recording medium P.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An image forming apparatus comprising:

an adjustment image forming unit that forms an adjustment image including a combination color, which is produced by superimposing colorants of two or more component colors, on an intermediate transfer body;

a transfer unit that transfers the adjustment image, formed on the intermediate transfer body, onto a recording medium;

a measuring unit that measures the combination color included in the adjustment image formed on the recording medium;

a density value calculating unit that calculates, in accordance with a measurement result of the combination color, a density value of a component color of a colorant that is formed in an uppermost layer on the recording medium among the two or more component colors; and a transfer parameter determining unit that determines a value of a transfer parameter in accordance with the calculated density value, wherein the transfer unit is controlled in accordance with a set value determined as the transfer parameter.

2. The image forming apparatus according to claim 1, wherein the adjustment image forming unit forms the adjustment image in a state where a plurality of candidate values of the transfer parameter have been set, and wherein the transfer parameter determining unit determines the value of the transfer parameter in accordance with a density value obtained by measuring the adjustment image which is formed in the state where the plurality of candidate values have been set.

3. The image forming apparatus according to claim 1, wherein the adjustment image forming unit forms an adjustment image including an image of a combination color, the image extending in a substantially band shape along a lateral direction of the recording medium, wherein the measuring unit measures colors at a plurality of measurement points of the image of the combination color, and wherein the transfer parameter determining unit determines the value of the transfer parameter in accordance with a degree of variation of a plurality of density values obtained through measurement at the plurality of measurement points.

4. The image forming apparatus according to claim 2, wherein the adjustment image forming unit forms an adjustment image including an image of a combination color, the image extending in a substantially band shape along a lateral direction of the recording medium, wherein the measuring unit measures colors at a plurality of measurement points of the image of the combination color, and wherein the transfer parameter determining unit determines the value of the transfer parameter in accordance with a degree of variation of a plurality of density values obtained through measurement at the plurality of measurement points.

5. An image forming method comprising:

forming an adjustment image including a combination color which is produced by superimposing colorants of two or more component colors, on an intermediate transfer body;

transferring the adjustment image, formed on the intermediate transfer body, onto a recording medium;

measuring the combination color included in the adjustment image formed on the recording medium;

calculating, in accordance with a measurement result of the combination color, a density value of a component color of a colorant that is formed in an uppermost layer on the recording medium among the two or more component colors; and determining a value of a transfer parameter in accordance with the calculated density value, in accordance with a set value determined as the transfer parameter.

6. A non-transitory computer readable medium storing a program causing a computer to execute a process for controlling an image forming apparatus including a measuring unit that measures colors of an image formed on a recording medium, the process comprising:

forming an adjustment image including a combination color, which is produced by superimposing colorants of two or more component colors, on an intermediate transfer body;

transferring the adjustment image, formed on the intermediate transfer body, onto a recording medium;

measuring the combination color included in the adjustment image formed on the recording medium;

calculating, in accordance with a measurement result of the combination color, a density value of a component color of a colorant that is formed in an uppermost layer on the recording medium among the two or more component colors; and determining a value of a transfer parameter in accordance with the calculated density value, in accordance with a set value determined as the transfer parameter.

* * * * *